United States Patent
Zhou et al.

(10) Patent No.: US 8,598,302 B2
(45) Date of Patent: Dec. 3, 2013

(54) PERYLENETETRACARBOXYLIC DIIMIDE ORGANIC SEMICONDUCTOR MATERIAL AND THE PREPARATION METHOD AND APPLICATION THEREOF

(75) Inventors: Mingjie Zhou, Guangdong (CN); Jie Huang, Guangdong (CN); Rong Guan, Guangdong (CN)

(73) Assignee: Ocean's King Lighting Science & Technology Co., Ltd., Guangdong (CN)

( * ) Notice: Subject to any disclaimer, the term of this patent is extended or adjusted under 35 U.S.C. 154(b) by 0 days.

(21) Appl. No.: 13/821,642

(22) PCT Filed: Sep. 10, 2010

(86) PCT No.: PCT/CN2010/076802
§ 371 (c)(1),
(2), (4) Date: Mar. 8, 2013

(87) PCT Pub. No.: WO2012/031403
PCT Pub. Date: Mar. 15, 2012

(65) Prior Publication Data
US 2013/0165616 A1    Jun. 27, 2013

(51) Int. Cl.
*C08G 65/38*    (2006.01)

(52) U.S. Cl.
USPC ............. 528/216; 528/94; 528/117; 528/118; 528/54; 528/62; 528/64; 526/171; 526/239

(58) Field of Classification Search
USPC ................. 528/216, 94, 117, 118, 54, 62, 64; 526/171, 239
See application file for complete search history.

(56) References Cited

U.S. PATENT DOCUMENTS

2003/0181721 A1*  9/2003  Wurthner et al. ............... 546/37

* cited by examiner

*Primary Examiner* — Shane Fang
(74) *Attorney, Agent, or Firm* — Rosenberg, Klein & Lee

(57) ABSTRACT

A perylenetetracarboxylic acid diimide organic semiconductive material is represented by the following formula (I), which belongs to the field of photoelectric material. In formula (I), n is an integer of 1-100, $R_1$, $R_2$ or $R_3$ is hydrogen, $C_1$-$C_{20}$ alkyl, $C_1$-$C_{20}$ alkoxyl, phenyl or alkoxyphenyl, $R_4$ or $R_5$ is $C_1$-$C_{20}$ alkyl, $R_6$ or $R_7$ is hydrogen, $C_1$-$C_{20}$ alkyl, $C_1$-$C_{20}$ alkoxyl or phenyl.

10 Claims, 2 Drawing Sheets

PERYLENETETRACARBOXYLIC DIIMIDE ORGANIC SEMICONDUCTOR MATERIAL AND THE PREPARATION METHOD AND APPLICATION THEREOF

FIELD OF THE INVENTION

The present invention relates to an organic semiconductor material, and more specifically to a perylenetetracarboxylic diimide organic semiconductor material.

The present invention also relates to the preparation method and application of the perylenetetracarboxylic diimide organic semiconductor material.

BACKGROUND OF THE INVENTION

It has been the research hotspot and difficulty in the photovoltaic field to use cheap materials for preparation of the solar cell having low cost and high efficiency. The current silicon solar cell used for ground has complicated production process and high cost, making its application restricted. In order to reduce the cost and expand the scope of application, people have been looking for a new solar cell material for a long time. The polymer solar cell has attracted a lot of attention because of such advantages as low-priced raw materials, light weight, flexibility, simple production processes, and allowance of preparation of large area by coating, printing and other means. It will have a very huge market prospect if its energy conversion efficiency can be improved to near the level of the commercial silicon solar cell. Since N. S. Sariciftci et al. reported in 1992 in the SCIENCE (N. S Sariciftci, L. Smilowitz, A. J. Heeger, et al. Science, 1992, 258, 1474) about the photoinduced electron transfer phenomenon between the conjugated polymer and C60, the polymer solar cell has received a great deal of research and obtained rapid development. Currently, the research of the polymer solar cell is mainly focused on the blend system of the donor and acceptor; the energy conversion efficiency of the blend system of PTB7 and PC71BM has attained 7.4% (Y. Liang et al., Adv. Mater.; DOI:10.1002/adma.200903528), but is still much lower than that of the inorganic solar cell. There are the following main limiting factors that restrict the performance improvement: The organic semiconductor device has a relatively low carrier mobility, the device has a spectral response not matching with the solar radiation spectrum, the red light region having a high photon flux has not been used effectively, and the carrier has a low electrode collecting efficiency, etc. In order to make the polymer solar cell get actual application, it is still the priority of the research area to develop new materials and greatly improve the energy conversion efficiency.

Perylenetetracarboxylic diimide and its derivatives have a large co-benzene-ring plane structure and a two-imine-ring structure, strong absorption in the visible light region, high light, heat and environmental stability, high electron affinity (a low LUMO level), and high electron mobility along the stacking direction because of the π-π stacking between its big conjugated π bonds. Therefore, it has shown broad application prospects in a variety of fields such as the organic solar cell. However, because perylenetetracarboxylic diimide and its derivatives contain a large planar conjugated system as well as have good molecular coplanarity, strong interaction of the intermolecular big π bond, and high lattice energy, they have poor solubility and film-forming processing performance, which make the prepared device prone to the phase separation problems, thus affecting the exciton diffusion efficiency and leading to the loss of energy. Besides, perylenetetracarboxylic diimide and its derivatives, having absorption spectra mainly concentrated in the visible region, have an absorption range not wide enough and a degree of matching with the sunlight emission spectrum not high enough, and thus cannot effectively use the sunlight, which also reduces the photoelectric conversion efficiency of the organic solar cell.

SUMMARY OF THE INVENTION

A purpose of the present invention is to provide a perylenetetracarboxylic diimide organic semiconductor material to solve the above problems, as well as the preparation method and application of the organic semiconductor material.

A perylenetetracarboxylic diimide organic semiconductor material is provided, having the following structural formula (I):

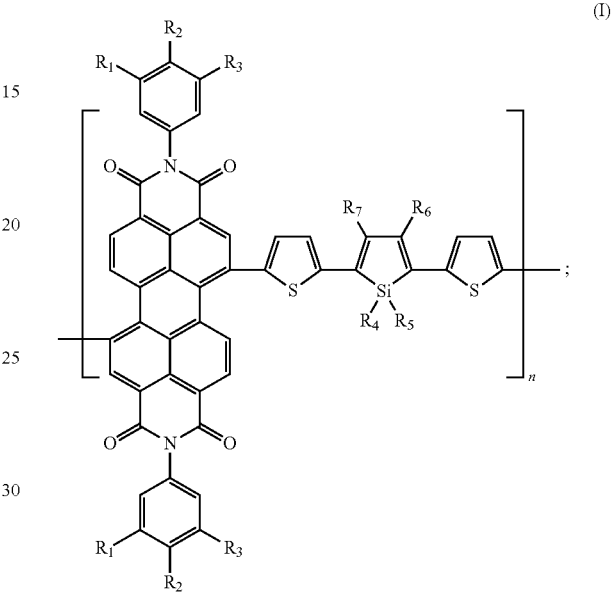

where: n is an integer of 1-100; $R_1$, $R_2$ and $R_3$ are a hydrogen atom, a $C_1$-$C_{20}$ alkyl group, a $C_1$-$C_{20}$ alkoxyl group, a phenyl group or alkoxy benzene, respectively; $R_4$ and $R_5$ are a $C_1$-$C_{20}$ alkyl group, respectively; and $R_6$ and $R_7$ are a hydrogen atom, a $C_1$-$C_{20}$ alkyl group, a $C_1$-$C_{20}$ alkoxyl group or a phenyl group.

The above perylenetetracarboxylic diimide organic semiconductor material was prepared by the following method:

In an oxygen-free environment, making the perylenetetracarboxylic diimide dibromide with a structural formula of

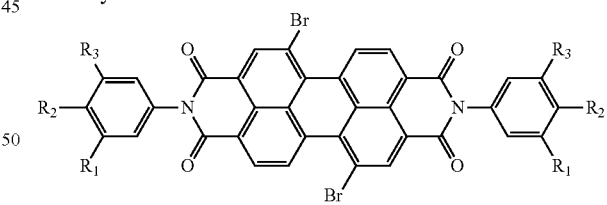

and the 2,5-bis(5-tributyltin-thienyl)silole derivative with a structural formula of

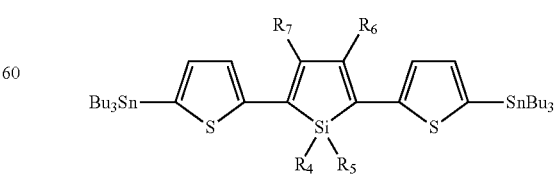

have the Stille coupling reaction at a molar ratio of 1:1 to 2:1 at the temperature of 50° C. to 130° C. in the presence of the catalyst and organic solvent for 24 h to 72 h, thus obtaining a reactant mixture solution containing the perylenetetracarboxylic diimide organic semiconductor material with the structural formula of

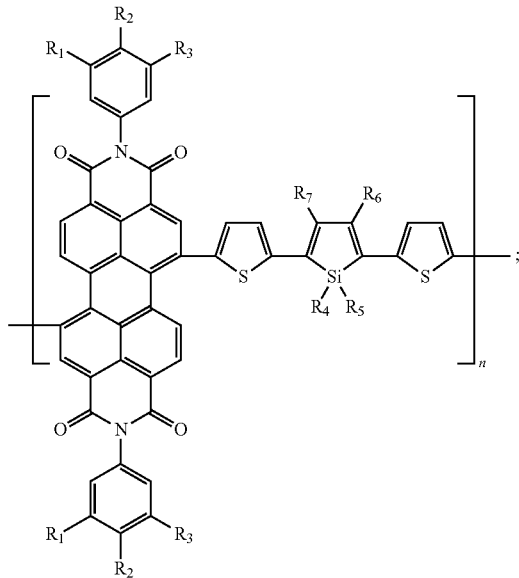

wherein the organic solvent is at least one of tetrahydrofuran (THF, hereinafter the same), ethylene glycol dimethyl ether, dioxane, N,N-dimethylformamide (DMF, hereinafter the same), and benzene or toluene; the catalyst is an organic palladium catalyst or a mixture of the organic palladium and an organophosphine ligand having a molar ratio of the organic palladium to the organophosphine ligand of 1:1-20, with the organic palladium being $Pd_2(dba)_3$, $Pd(PPh_3)_4$ or $Pd(PPh_3)_2Cl_2$ and the organophosphine ligand being $P(o\text{-}Tol)_3$; adding the catalyst at a molar ratio of 0.01% to 20% of the total materials;

The reaction formula is as follows:

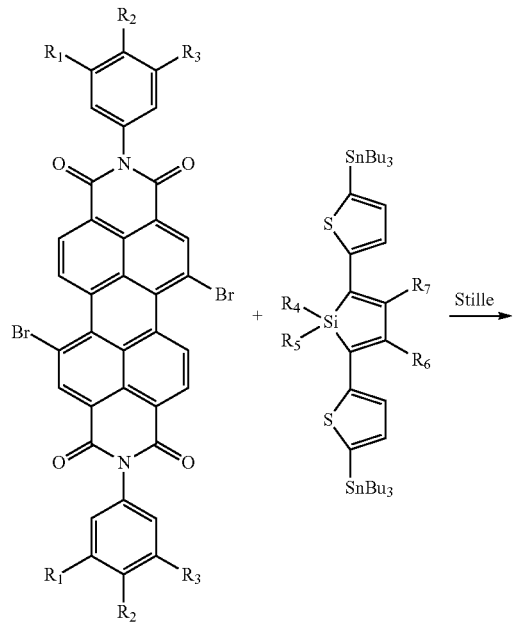

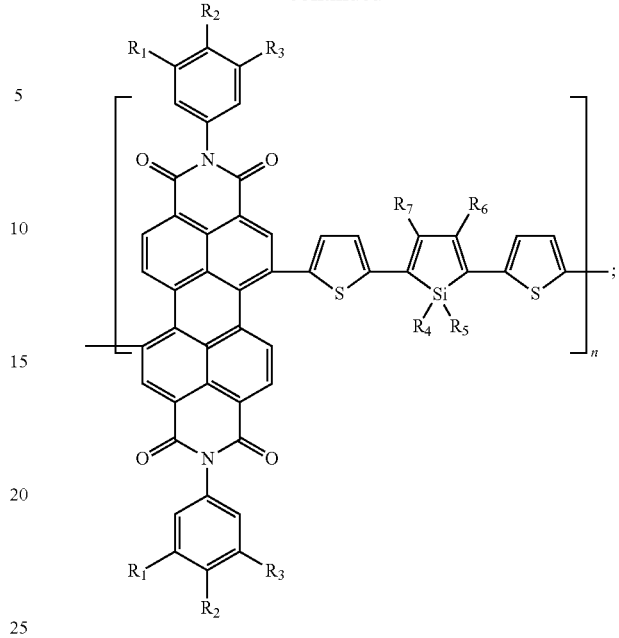

where: n is an integer of 1-100; $R_1$, $R_2$ and $R_3$ are a hydrogen atom, a $C_1$-$C_{20}$ alkyl group, a $C_1$-$C_{20}$ alkoxyl group, a phenyl group or alkoxy benzene, respectively; $R_4$ and $R_5$ are a $C_1$-$C_{20}$ alkyl group, respectively; and $R_6$ and $R_7$ are a hydrogen atom, a $C_1$-$C_{20}$ alkyl group, a $C_1$-$C_{20}$ alkoxyl group or a phenyl group, respectively.

Another purpose of the present invention is to provide applications of the above organic semiconductor material in such fields as polymer solar cells, organic electroluminescent devices, organic field-effect transistors, organic optical memories, organic non-linear devices, and organic laser devices.

The present invention has at least the following advantages compared to the existing technology:

The present invention developed the perylenetetracarboxylic diimide organic semiconductor material containing the dithieno[3,2-b:2',3'-d]silole unit. Its solubility was improved by the following two ways: one was to introduce a substituent at its "bay" site; and the other was to copolymerize the perylenetetracarboxylic diimide monomer with the dithieno[3,2-b:2',3'-d]silole monomer. Besides, dithieno[3,2-b:2',3'-d]silole has a completely flat crystal structure the two thiophene rings in its structural unit are in the same plane. This structure can effectively prolong conjugate properties of polymers and reduce bandwidth of polymers; and such a coplanar structure makes the carrier transfer between the two main chains easier, thus increasing the carrier mobility. Moreover, the solubility can be increased by introducing an alkyl chain into dithieno [3,2-b:2',3'-d]silole, so as to improve the processing properties. Therefore, based on the above properties, the material containing the dithieno[3,2-b:2',3'-d]silole structure unit has received very extensive research in the organic solar cell. Thus, we introduced the dithieno[3,2-b:2',3'-d]silole into the electron-deficient perylenetetracarboxylic diimide unit to form a donor-acceptor structure, which is copolymerized with perylenetetracarboxylic diimide, so as to adjust the band gap of the polymer and push its absorption band edge toward the infrared and near-infrared region. The modified perylenetetracarboxylic diimide has good solubility, strong absorbance, and a wide absorption range that can be extended to the near-infrared region, which improve its utilization rate of sunlight and make it have good stability and charge transfer property, and thus it has a good application prospect in such fields as the organic solar cell.

DETAILED DESCRIPTION

Figure 1:
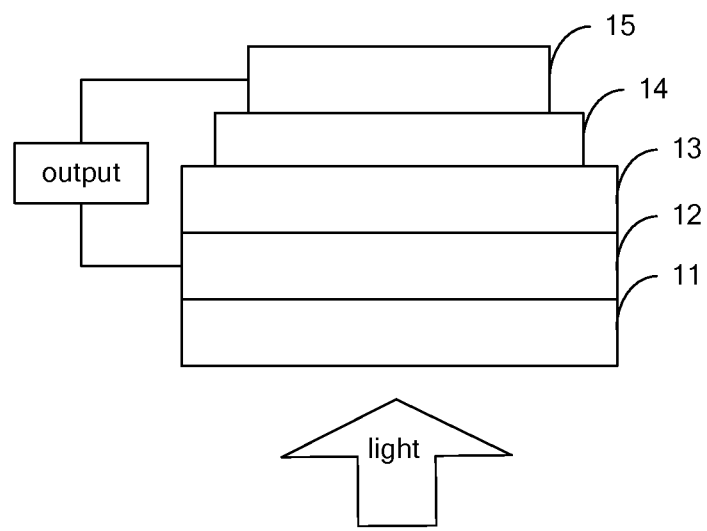
FIG. 1 is a structural schematic view of the organic solar cell device with the organic semiconductor material of the present invention as the active layer.

The present invention provides a perylenetetracarboxylic diimide organic semiconductor material, which has the following structural formula (I):

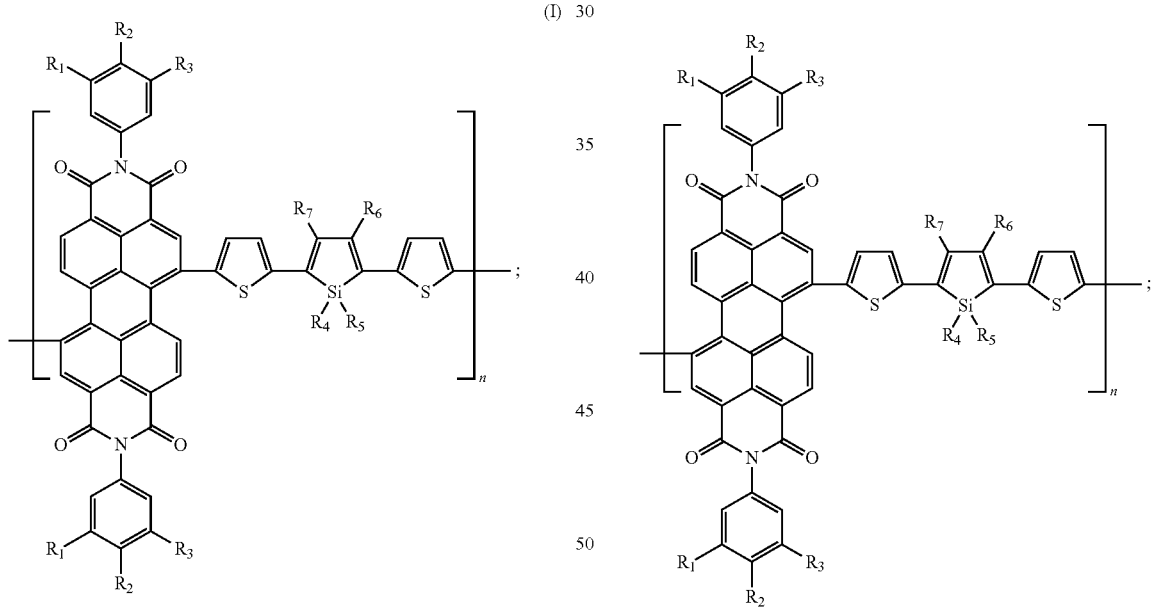

where: n is an integer of 1-100; $R_1$, $R_2$ and $R_3$ can be identical or different, and are selected from the group consisting of a hydrogen atom, a $C_1$-$C_{20}$ alkyl group, a $C_1$-$C_{20}$ alkoxyl group, a phenyl group and alkoxy benzene, etc.; $R_4$ and $R_5$ are a $C_1$-$C_{20}$ alkyl group; $R_6$ and $R_7$ can be identical or different, and are selected from the group consisting of a hydrogen atom, a $C_1$-$C_{20}$ alkyl group, a $C_1$-$C_{20}$ alkoxyl group and a phenyl group.

The above perylenetetracarboxylic diimide organic semiconductor material was prepared by the following method:

Step S1: In an oxygen-free environment, in the presence of the catalyst and organic solvent, making the perylenetetracarboxylic diimide dibromide with a structural formula of

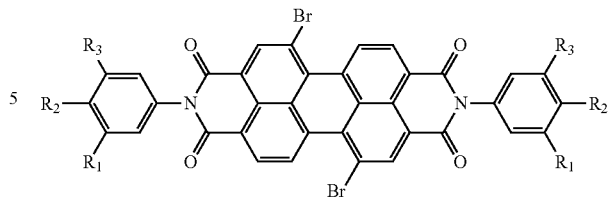

and the 2,5-bis(5-tributyltin-thienyl)silole derivative with a structural formula of

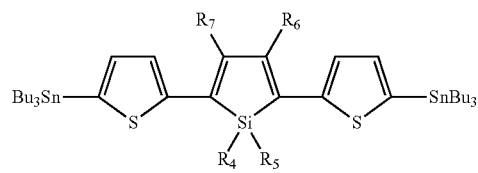

have the Stille coupling reaction at a molar ratio of 1:1 to 2:1 at the temperature of 50° C. to 130° C. for 24 h to 72 h, thus obtaining a reactant mixture solution containing the perylenetetracarboxylic diimide organic semiconductor material with the structural formula of

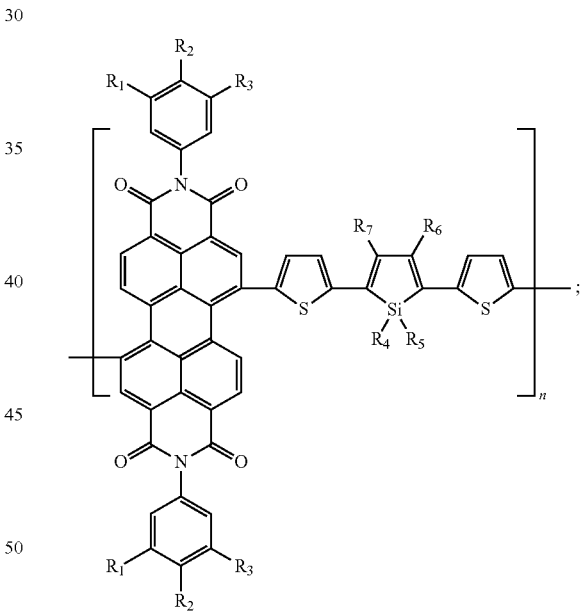

wherein the organic solvent is at least one of tetrahydrofuran (THF, hereinafter the same), ethylene glycol dimethyl ether, dioxane, N,N-dimethylformamide (DMF, hereinafter the same), and benzene or toluene; the catalyst is an organic palladium catalyst or a mixture of the organic palladium and an organophosphine ligand, having a molar ratio of the organic palladium to the organophosphine ligand of 1:1-20, with the organic palladium being $Pd_2(dba)_3$, $Pd(PPh_3)_4$ or $Pd(PPh_3)_2Cl_2$ and the organophosphine ligand being $P(o\text{-}Tol)_3$; adding the catalyst at a molar ratio of 0.01% to 20% of the total materials;

The reaction formula is as follows:

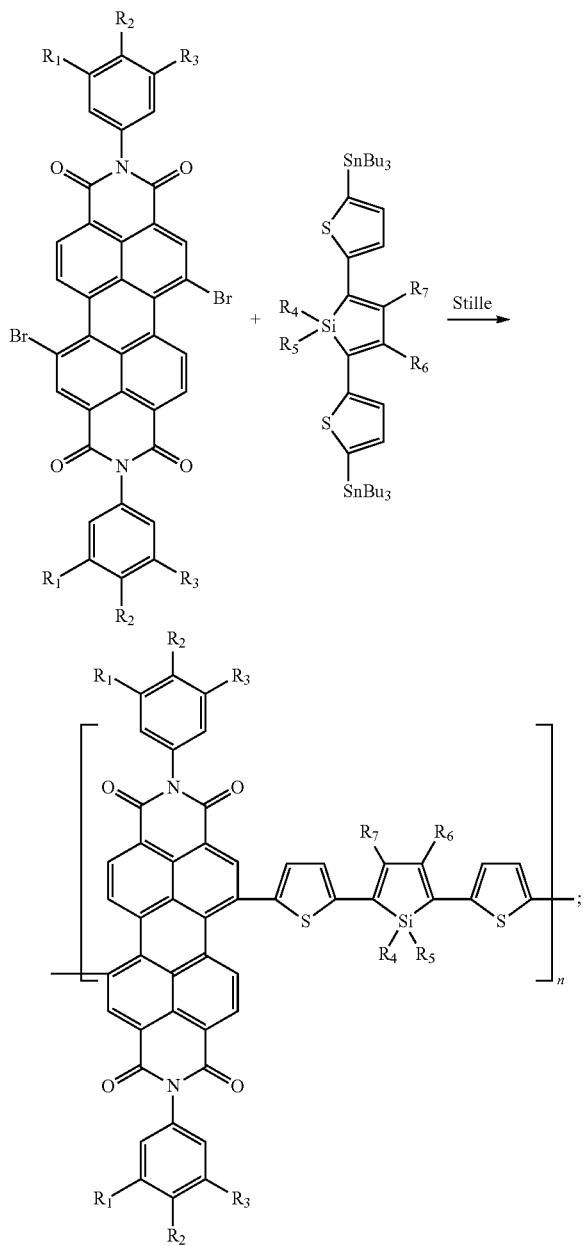

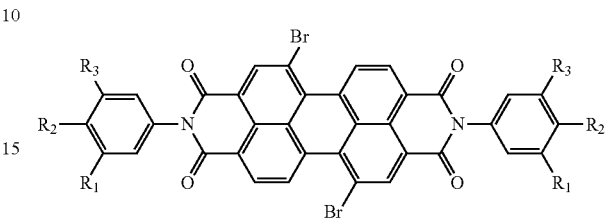

where: n is an integer of 1-100; $R_1$, $R_2$ and $R_3$ can be identical or different, and are selected from the group consisting of a hydrogen atom, a $C_1$-$C_{20}$ alkyl group, a $C_1$-$C_{20}$ alkoxyl group, a phenyl group and alkoxy benzene, etc.; $R_4$ and $R_5$ are a $C_1$-$C_{20}$ alkyl group; $R_6$ and $R_7$ can be identical or different, and are selected from the group consisting of a hydrogen atom, a $C_1$-$C_{20}$ alkyl group, a $C_1$-$C_{20}$ alkoxyl group and a phenyl group;

Step S2: adding the reactant mixture solution in step S1 dropwise into methanol for sedimentation processing, then suction-filtering, washing with methanol, and drying, thus obtaining the organic semiconductor material containing impurities; then dissolving with toluene to obtain the toluene solution containing the organic semiconductor material;

Step S3: then adding the toluene solution containing the organic semiconductor material into an aqueous solution of sodium diethyldithiocarbamate, heating and stirring the mixture solution at 80° C.-100° C., passing the mixture solution through the alumina chromatography column to separate the organic semiconductor material, then leaching with chlorobenzene followed by decompression removal of the chlorobenzene organic solvent, and finally extracting the organic semiconductor material with the acetone Soxhlet, thus obtaining the solid organic semiconductor material.

In the present invention, the preparation processes of both the perylenetetracarboxylic diimide dibromide with a structural formula of

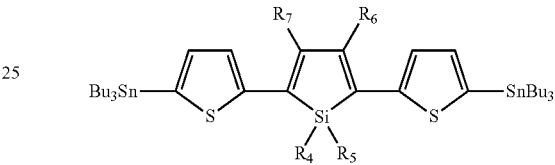

and the 2,5-bis(5-tributyltin-thienyl)silole derivative with a structural formula of belong to the existing technology, and will not be described here again.

The oxygen-free environment of the present invention is composed of the mixture of nitrogen and/or inert gas.

The present invention developed the perylenetetracarboxylic diimide copolymer organic semiconductor material containing the silole unit. Its solubility was improved by the following two ways: One was to introduce a substituent at its "bay" site; and the other was to copolymerize the perylenetetracarboxylic diimide monomer with other monomers.

Thiophene is of a five-membered ring structure and in conformity with the Huckel's rule, and has a moderate bandgap, wide spectral response, and good thermal and environmental stability. Therefore, the thiophene organic semiconductor material is a promising material, and its application in the photovoltaic field has been extensively studied.

Silole, as a silacyclopentadiene, can be regarded as a product of cyclopentadiene whose carbon bridge connecting both ends of butadiene is substituted by silicon. After introduction of a silicon atom into the butadiene conjugated system, the Si—C single bond is vertical to the conjugate ring of butadiene, and the σ* track of the two σ bonds outside the Si atomic ring is conjugated with the π* track of the butadiene portion of the ring to form the conjugated σ*-π*, making silole have an LUMO energy level lower than other five-membered aromatic heterocycles, e.g. pyrrole, furan and thiophene. The unique structure of the aromatic compound and the low LUMO energy level confer silole special photovoltaic properties. A diphenyl silole unit is a unit containing both two six-membered benzene rings and one five-membered silole ring; because of its good flatness and degree of conjugation, such modifying groups as an alkyl group can be introduced into the sites 1, 1, 3, 4 of silole to improve its solubility and solution processability properties. Therefore, we copolymerized it with perylenetetracarboxylic diimide, so as to adjust the band gap of the polymer and push its absorption band edge toward the infrared and near-infrared region. The modified perylenetetracarboxylic diimide has good solubility, strong absorbance, and a wide absorption range that can be extended to the near-infrared region, which improve its utilization rate of sunlight and make it have good stability and charge transfer property, and thus it has a good application prospect in such fields as the organic solar cell.

The preferred examples of the present invention will further be described in detail below with reference to drawings.

Example 1

Preparation of poly(N,N'-di-(3,4,5-tri-methylbenzene)-3,4,9,10-perylene diimide-1,1,3,4-tetramethyl-2,5-bis-thienyl silole) (n=8)

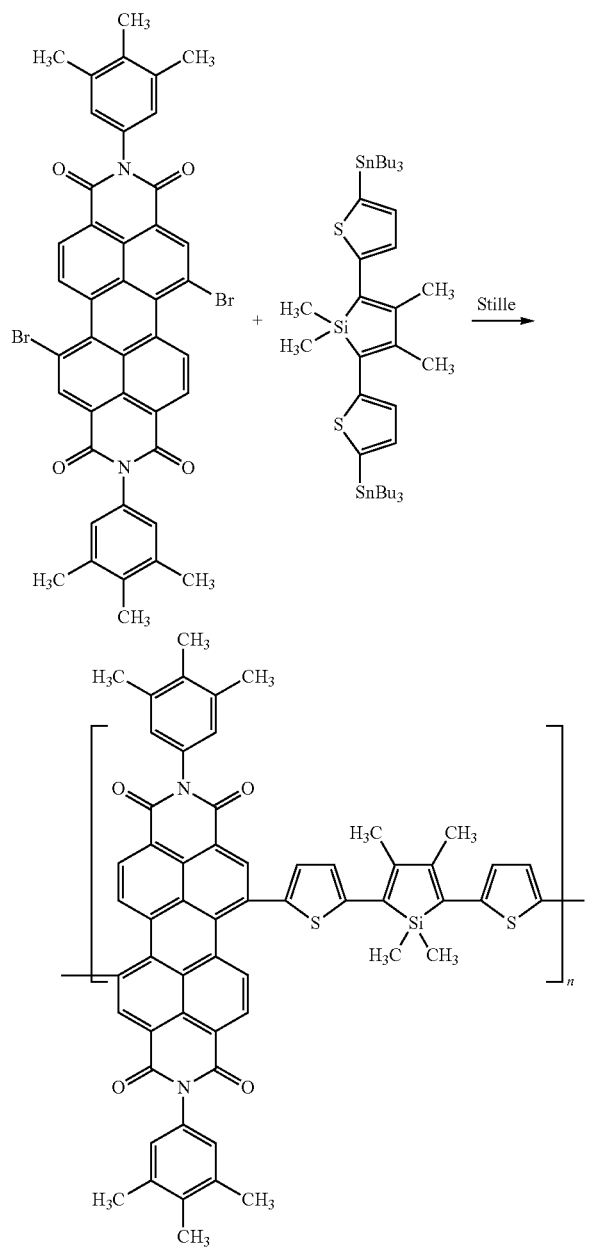

Under the protection of nitrogen, bubbling nitrogen into a DMF solution (18 mL) containing 0.5 mmol N,N'-di-(3,4,5-tri-methylbenzene)-1,7-dibromo-3,4,9,10-perylene diimide and 0.5 mmol 1,1,3,4-tetramethyl-2,5-bis(5-tributyltin-thienyl)silole for 0.5 h to remove the residual oxygen. Then adding 0.015 mmol $Pd_2(dba)_3$ and 0.030 mmol $P(o\text{-}Tol)_3$, continuing to bubble nitrogen for 0.5 h to remove the residual oxygen; and then heating the solution to 80° C. to react for 48 h to obtain the reactant mixture solution containing poly(N,N'-di-(3,4,5-tri-methylbenzene)-3,4,9,10-perylene diimide-1,1,3,4-tetramethyl-2,5-bis-thienyl silole) (n=8).

Adding the mixture solution into methanol for sedimentation, suction-filtering, washing with methanol, and drying, then dissolving with toluene, and adding into an aqueous solution of sodium diethyldithiocarbamate; then heating the mixture solution to 90° C. and stirring overnight; passing the organic phase through the alumina chromatography column and leaching with chlorobenzene; decompressing to remove the organic solvent, sedimentating with methanol, suction-filtering, and extracting the obtained solid with the acetone Soxhlet for three days; sedimentating with methanol, suction-filtering. Pumping with a vacuum pump overnight to obtain the solid product of poly(N,N'-di-(3,4,5-tri-methylbenzene)-3,4,9,10-perylene diimide-1,1,3,4-tetramethyl-2,5-bis-thienyl silole) (n=8). Molecular weight (GPC, THF, R. I): $M_n$=80500, $M_w/M_n$=2.76.

Example 2

Poly(N,N'-di-(3,5-dimethylalkoxy-4-dodecyloxy benzene)-3,4,9,10-perylene diimide-1,1-dioctyl-3,4-diphenyl-2,5-bis-thienyl silole) (n=25)

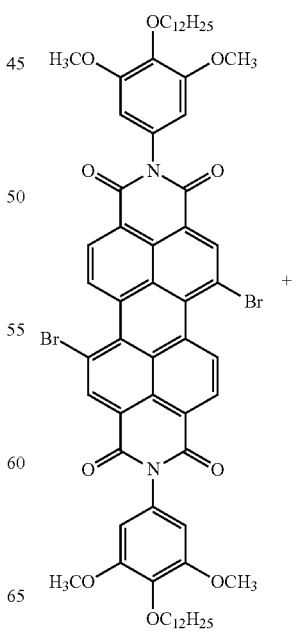

-continued

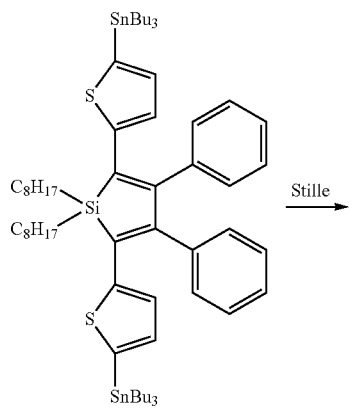

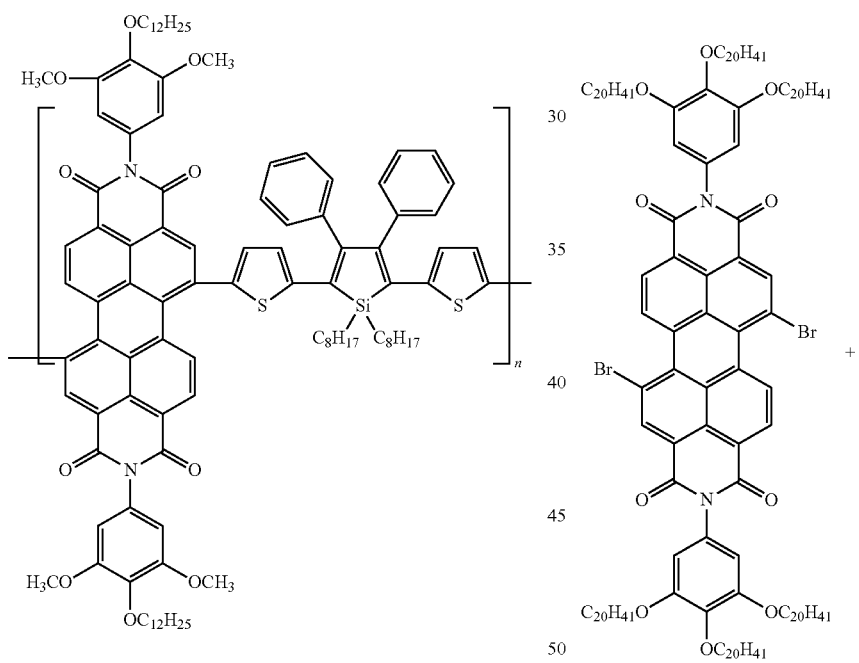

Under the protection of nitrogen, bubbling nitrogen into a dioxane solution (15 mL) containing 0.5 mmol N,N'-di-(3,5-dimethylalkoxy-4-dodecyloxy)-1,7-dibromo-3,4,9,10-perylene diimide-1,1-dioctyl-3,4-diphenyl-2,5-bis(5-tributyltin-thienyl)silole for 0.5 h to remove the residual oxygen. Then adding 10 mg Pd(PPh$_3$)$_2$Cl$_2$, continuing to bubble nitrogen for 0.5 h to remove the residual oxygen; then heating the solution to 85° C. to react for 36 h to obtain the reactant mixture solution containing poly(N,N'-di-(3,5-dimethylalkoxy-4-dodecyloxy benzene)-3,4,9,10-perylene diimide-1,1-dioctyl-3,4-diphenyl-2,5-bis-thienyl silole) (n=25).

Adding the mixture solution into methanol for sedimentation, suction-filtering, washing with methanol, and drying, then dissolving with toluene, and adding into an aqueous solution of sodium diethyldithiocarbamate; then heating the mixture solution to 90° C. and stirring overnight; passing the organic phase through the alumina chromatography column and leaching with chlorobenzene; decompressing to remove the organic solvent, sedimentating with methanol, suction-filtering, and extracting the obtained solid with the acetone Soxhlet for three days; sedimentating with methanol, and suction-filtering; pumping with a vacuum pump overnight to obtain the solid product of poly(N,N'-di-(3,5-dimethylalkoxy-4-dodecyloxy benzene)-3,4,9,10-perylene diimide-1,1-dioctyl-3,4-diphenyl-2,5-bis-thienyl silole) (n=25). Molecular weight (GPC, THF, R. I): $M_n$=42800, $M_w/M_n$=2.94.

Example 3

Poly(N,N'-di-(3,4,5-tri-eicosyl benzene)-3,4,9,10-perylene diimide-1,1,3,4-tetra-eicosyl-2,5-bis-thienyl silole) (n=100)

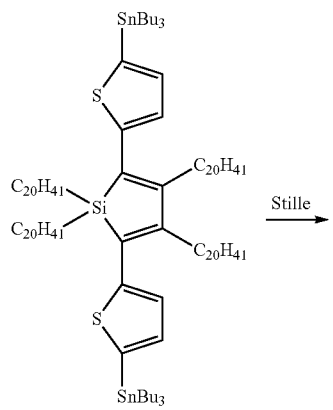

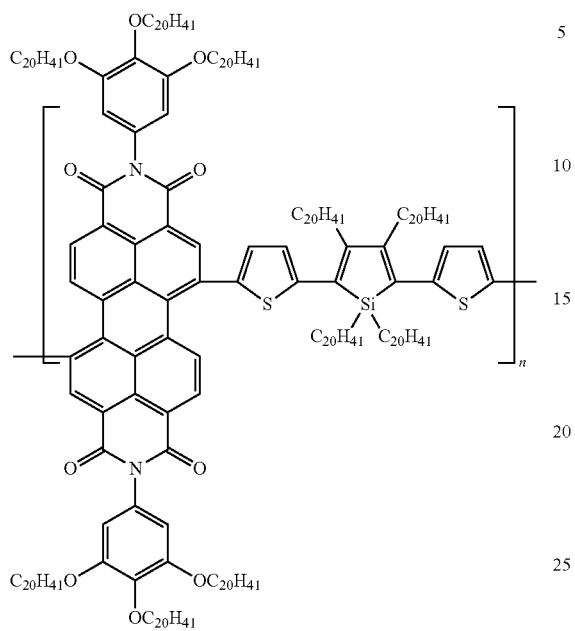

Example 4

Poly(N,N'-di-(3,5-di-dodecyloxy-4-eicosyl benzene)-3,4,9,10-perylene diimide-1,1-di-dioctyl-3,4-di-dodecyloxy-2,5-bis-thienyl silole) (n=43)

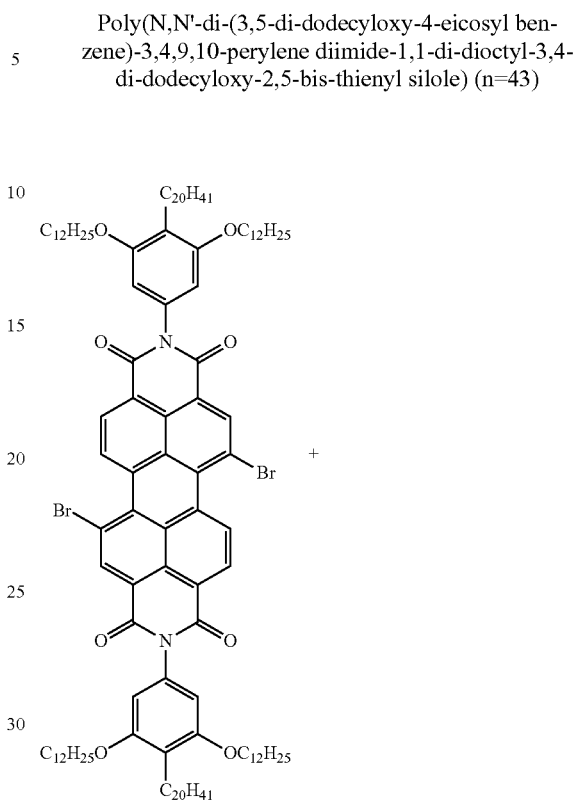

Under the protection of nitrogen, bubbling nitrogen into a toluene/THF solution (30 mL) containing 0.5 mmol N,N'-di-(3,4,5-tri-eicosyl benzene)-1,7-dibromo-3,4,9,10-perylene diimide and 0.5 mmol 1,1,3,4-tetra-eicosyl-2,5-bis(5-tributyltin-thienyl)silole for 0.5 h to remove the residual oxygen. Then adding 8 mg Pd(PPh$_3$)$_4$, continuing to bubble nitrogen for 0.5 h to remove the residual oxygen; then heating the solution to 80° C. to react for 72 h to obtain the reactant mixture solution containing poly(N,N'-di-(3,4,5-tri-eicosyl benzene)-3,4,9,10-perylene diimide-1,1,3,4-tetra-eicosyl-2,5-bis-thienyl silole) (n=100).

Adding the mixture solution into methanol for sedimentation, suction-filtering, washing with methanol, and drying, then dissolving with toluene, and adding into an aqueous solution of sodium diethyldithiocarbamate; then heating the mixture solution to 80° C. and stirring overnight; passing the organic phase through the alumina chromatography column and leaching with chlorobenzene; decompressing to remove the organic solvent, sedimentating with methanol, suction-filtering, extracting the obtained solid with the acetone Soxhlet for three days, sedimentating with methanol, and suction-filtering. Pumping with a vacuum pump overnight to obtain the solid product of poly(N,N'-di-(3,4,5-tri-eicosyl benzene)-3,4,9,10-perylene diimide-1,1,3,4-tetra-eicosyl-2, 5-bis-thienyl silole) (n=100). Molecular weight (GPC, THF, R. I): $M_n$=371800, $M_w/M_n$=3.12.

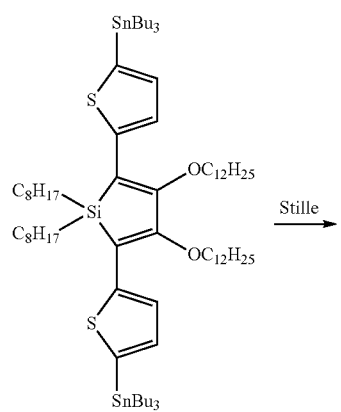

-continued

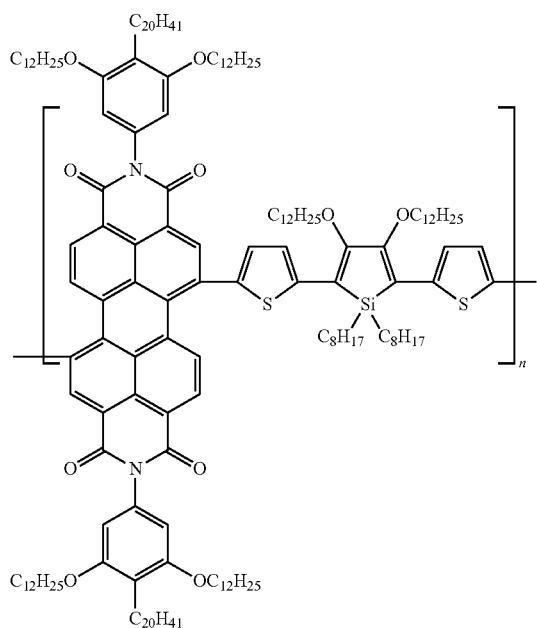

Under the protection of argon, bubbling argon into a benzene solution (20 mL) containing 0.52 mmol N,N'-di-(3,5-di-dodecyloxy-4-eicosl benzene)-1,7-dibromo-3,4,9,10-perylene diimide and 0.50 mmol 1,1-di-octyl-3,4-di-dodecyloxy-2,5-bis(5-tributyltin-thienyl)silole for 0.5 h to remove the residual oxygen. Then adding 5 mg Pd(PPh$_3$)$_2$Cl$_2$, continuing to bubble argon for 0.5 h to remove the residual oxygen, and then heating the solution to 130° C. to react for 24 h to obtain the reactant mixture solution containing poly (N,N'-di-(3,5-di-dodecyloxy-4-eicosyl benzene)-3,4,9,10-perylene diimide-1,1-di-octyl-3,4-di-dodecyloxy-2,5-bis-thienyl silole) (n=43).

Adding the mixture solution into methanol for sedimentation, suction-filtering, washing with methanol, and drying, then dissolving with toluene, and adding into an aqueous solution of sodium diethyldithiocarbamate; then heating the mixture solution to 80° C. and stirring overnight, passing the organic phase through the alumina chromatography column, and leaching with chlorobenzene; decompressing to remove the organic solvent, sedimentating with methanol, suction-filtering, and extracting the obtained solid with the acetone Soxhlet for three days; sedimentating with methanol, and suction-filtering; and pumping with a vacuum pump overnight to obtain the solid product of poly(N,N'-di-(3,5-di-dodecyloxy-4-eicosyl benzene)-3,4,9,10-perylene diimide-1,1-di-octyl-3,4-di-dodecyloxy-2,5-bis-thienyl silole) (n=43). Molecular weight (GPC, THF, R. I): $M_n$=116900, $M_w/M_n$=2.95.

Example 5

Poly(N,N'-di-(3,5-di-twenty benzene)-3,4,9,10-perylene diimide-1,1-di-dodecyl-3,4-dimethoxy-2,5-bis-thienyl silole) (n=81)

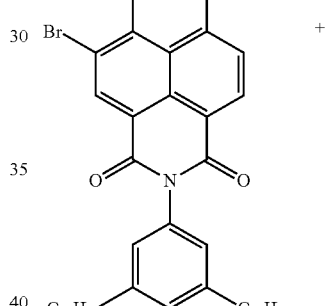

+

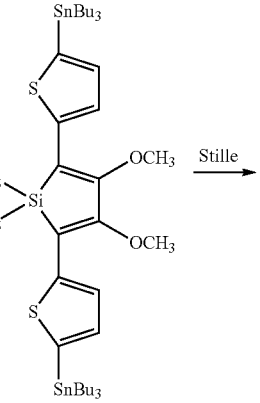

Stille →

17
-continued

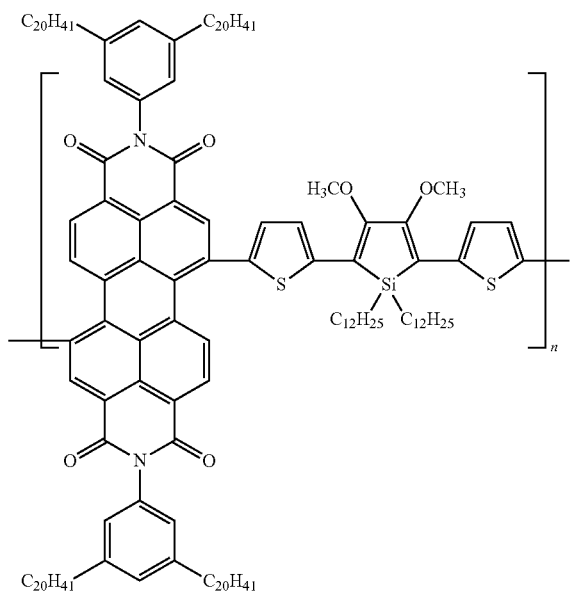

Under the protection of the mixed nitrogen and argon, bubbling the mixed nitrogen and argon into a toluene/DMF solution (25 mL) containing 0.51 mmol N,N'-di-(3,5-di-twenty benzene)-1,7-dibromo-3,4,9,10-perylene diimide and 0.5 mmol 1,1-di-dodecyl-3,4-dimethoxy-2,5-bis(5-tributyl-tin-thienyl)silole for 0.5 h to remove the residual oxygen. Then adding 10 mg Pd(PPh$_3$)$_4$, continuing to bubble the mixed nitrogen and argon for 0.5 h to remove the residual oxygen; and then heating the solution to 70° C. to react for 40 h to obtain the reactant mixture solution containing poly(N,N'-di-(3,5-di-twenty benzene)-3,4,9,10-perylene diimide-1,1-di-dodecyl-3,4-dimethoxy-2,5-bis-thienyl silole) (n=81).

Adding the mixture solution into methanol for sedimentation, suction-filtering, washing with methanol, and drying, then dissolving with toluene, and adding into an aqueous solution of sodium diethyldithiocarbamate; then heating the mixture solution to 80° C. and stirring overnight; passing the organic phase through the alumina chromatography column and leaching with chlorobenzene; decompressing to remove the organic solvent, and sedimentating with methanol; suction-filtering, and extracting the obtained solid with the acetone Soxhlet for three days; sedimentating with methanol, and suction-filtering; pumping with a vacuum pump overnight to obtain the solid product of poly(N,N'-di-(3,5-di-twenty benzene)-3,4,9,10-perylene diimide-1,1-di-dodecyl-3,4-dimethoxy-2,5-bis-thienyl silole) (n=81). Molecular weight (GPC, THF, R. I): $M_n$=189600, $M_w/M_n$=2.88.

18
Example 6

Poly(N,N'-di-(3,4,5-tri-phenylbenzene)-3,4,9,10-perylene diimide-1,1-dimethyl-2,5-bis-thienyl silole) (n=7)

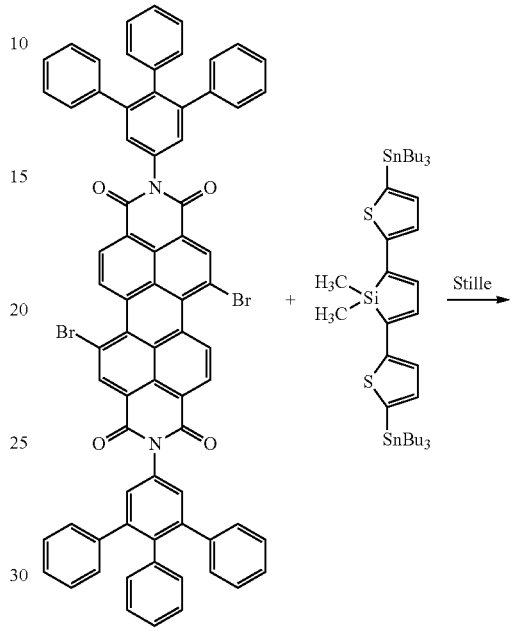

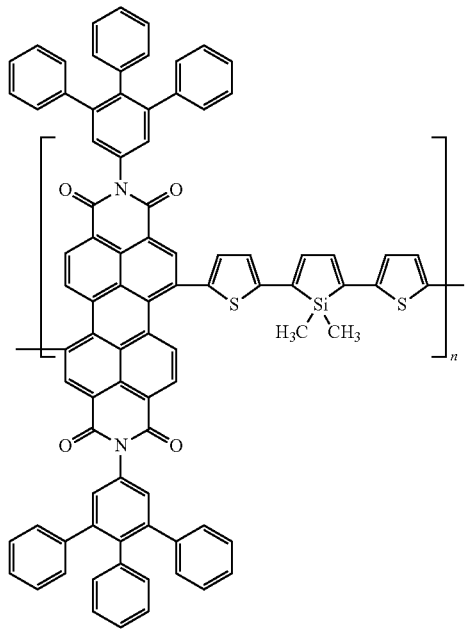

Under the protection of nitrogen, bubbling nitrogen into a dioxane/THF solution (18 mL) containing 0.75 mmol N,N'-di-(3,4,5-tri-phenylbenzene)-1,7-dibromo-3,4,9,10-perylene diimide and 0.5 mmol 1,1-dimethyl-2,5-bis(5-tributyltin-thienyl)silole for 0.5 h to remove the residual oxygen. Then adding 8 mg Pd(PPh$_3$)$_2$Cl$_2$, continuing to bubble nitrogen for 0.5 h to remove the residual oxygen; then heating the solution to 50° C. to react for 72 h to obtain the reactant mixture solution containing poly(N,N'-di-(3,4,5-tri-phenylbenzene)-3,4,9,10-perylene diimide-1,1-dimethyl-2,5-bis-thienyl silole) (n=7).

Adding the mixture solution into methanol for sedimentation, suction-filtering, washing with methanol, and drying, then dissolving with toluene, and adding into an aqueous solution of sodium diethyldithiocarbamate; then heating the mixture solution to 90° C. and stirring overnight; passing the organic phase through the alumina chromatography column and leaching with chlorobenzene; decompressing to remove the organic solvent, and sedimentating with methanol. Suction-filtering, and extracting the obtained solid with the acetone Soxhlet for three days; sedimentating with methanol, suction-filtering, and pumping with a vacuum pump overnight to obtain the solid product of poly(N,N'-di-(3,4,5-tri-phenylbenzene)-3,4,9,10-perylene diimide-1,1-dimethyl-2,5-bis-thienyl silole) (n=7). Molecular weight (GPC, THF, R. I): $M_n$=9120, $M_w/M_n$=2.72.

-continued

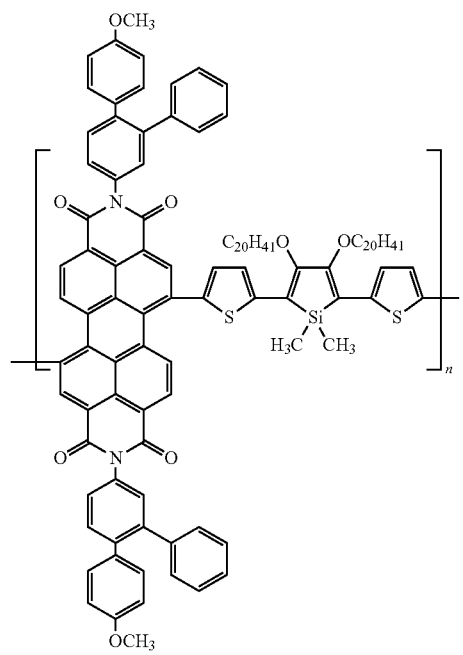

Example 7

Poly(N,N'-di-(3-phenyl-4-p-methoxyphenyl benzene)-3,4,9,10-perylene diimide-1,1-dimethyl-3,4-di-eicosyl-2,5-bis-thienyl silole) (n=15)

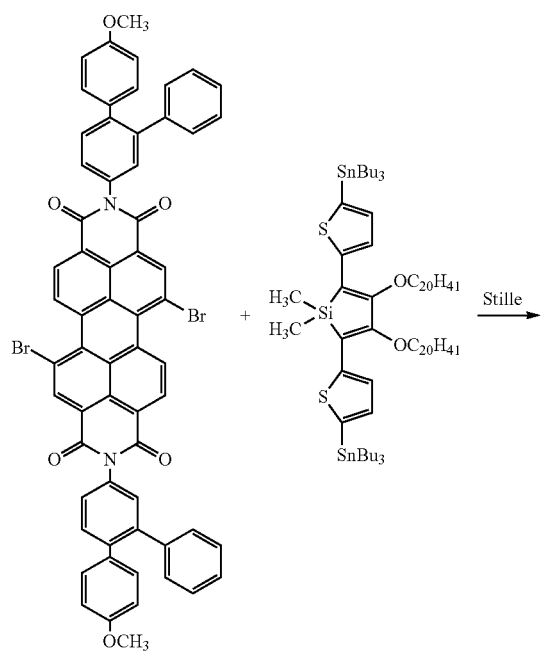

Under the protection of nitrogen, bubbling nitrogen into a dioxane/THF solution (20 mL) containing 0.65 mmol N,N'-di-(3-phenyl-4-p-methoxyphenyl benzene)-1,7-dibromo-3,4,9,10-perylene diimide and 0.5 mmol 1,1-dimethyl-3,4-di-eicosyl-2,5-bis(5-tributyltin-thienyl)silole for 0.5 h to remove the residual oxygen. Then adding 9 mg Pd(PPh$_3$)$_2$Cl$_2$, continuing to bubble nitrogen for 0.5 h to remove the residual oxygen; then heating the solution to 75° C. to react for 72 h to obtain the reactant mixture solution containing poly(N,N'-di-(3-phenyl-4-p-methoxyphenyl benzene)-3,4,9,10-perylene diimide-1,1-dimethyl-3,4-di-eicosyl-2,5-bis-thienyl silole) (n=15).

Adding the mixture solution into methanol for sedimentation, suction-filtering, washing with methanol, and drying, then dissolving with toluene, and adding into an aqueous solution of sodium diethyldithiocarbamate; then heating the mixture solution to 100° C. and stirring overnight; passing the organic phase through the alumina chromatography column and leaching with chlorobenzene; decompressing to remove the organic solvent, sedimentating with methanol, suction-filtering, and extracting the obtained solid with the acetone Soxhlet for three days; sedimentating with methanol, suction-filtering, and pumping with a vacuum pump overnight to obtain the solid product of poly(N,N'-di-(3-phenyl-4-p-methoxyphenyl benzene)-3,4,9,10-perylene diimide-1,1-dimethyl-3,4-di-eicosyl-2,5-bis-thienyl silole) (n=15). Molecular weight (GPC, THF, R. I): $M_n$=27600, $M_w/M_n$=2.93.

Example 8

Poly(N,N'-di-(3,5-di-eicosyl-4-p-dodecyloxy-benzene)-3,4,9,10-perylene diimide-1,1-dihexyl-3,4-dioctyloxy-2,5-bis-thienyl silole) (n=67)

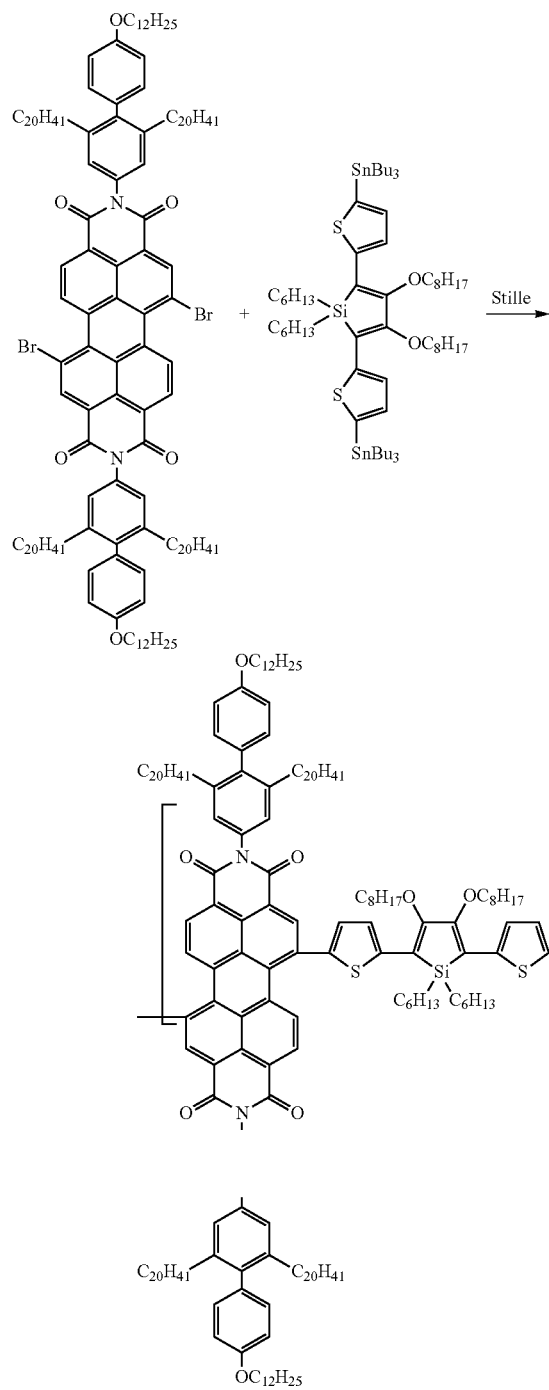

Under the protection of nitrogen, bubbling nitrogen into a toluene/THF solution (30 mL) containing 0.5 mmol N,N'-di-(3,5-di-eicosyl-4-p-dodecyloxy-benzene)-1,7-dibromo-3,4,9,10-perylene diimide and 0.50 mmol 1,1-dihexyl-3,4-dioctyloxy-2,5-bis(5-tributyltin-thienyl)silole for 0.5 h to remove the residual oxygen. Then adding 8 mg Pd(PPh$_3$)$_4$, continuing to bubble nitrogen for 0.5 h to remove the residual oxygen; then heating the solution to 80° C. to react for 72 h to obtain the reactant mixture solution containing poly(N,N'-di-(3,5-di-eicosyl-4-p-dodecyloxy-benzene)-3,4,9,10-perylene diimide-1,1-dihexyl-3,4-dioctyloxy-2,5-bis-thienyl silole) (n=67).

Adding the mixture solution into methanol for sedimentation, suction-filtering, washing with methanol, and drying, then dissolving with toluene, and adding into an aqueous solution of sodium diethyldithiocarbamate; then heating the mixture solution to 80° C. and stirring overnight; passing the organic phase through the alumina chromatography column and leaching with chlorobenzene; decompressing to remove the organic solvent, sedimentating with methanol, suction-filtering, extracting the obtained solid with the acetone Soxhlet for three days, sedimentating with methanol, suction-filtering, and pumping with a vacuum pump overnight to obtain the solid product of poly(N,N'-di-(3,5-di-eicosyl-4-p-dodecyloxy-benzene)-3,4,9,10-perylene diimide-1,1-dihexyl-3,4-dioctyloxy-2,5-bis-thienyl silole) (n=67). Molecular weight (GPC, THF, R. I): $M_n$=194700, $M_w/M_n$=3.11.

The present invention also provides the applications of the perylenetetracarboxylic diimide organic semiconductor material with a structural formula of

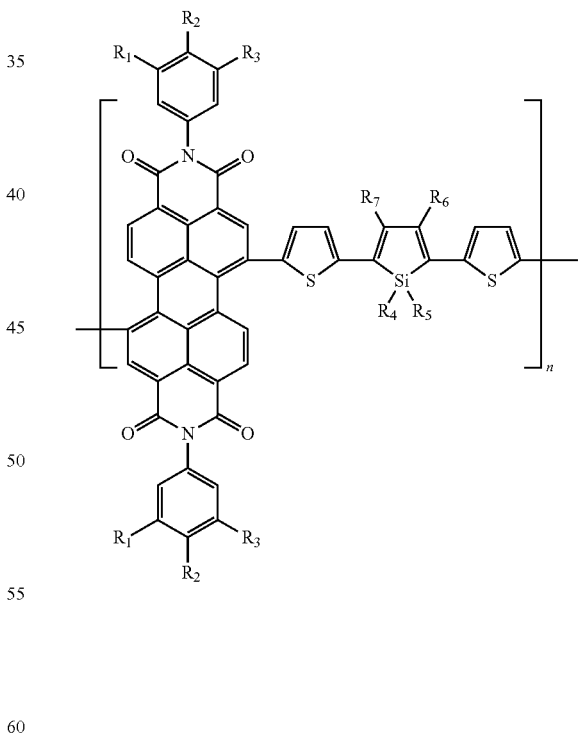

(where: n is an integer of 1-100; $R_1$, $R_2$ and $R_3$ are a hydrogen atom, a $C_1$-$C_{20}$ alkyl group, a $C_1$-$C_{20}$ alkoxyl group, a phenyl group or alkoxy benzene; $R_4$ and $R_5$ are a $C_1$-$C_{20}$ alkyl group; and $R_6$ and $R_7$ are a hydrogen atom, a $C_1$-$C_{20}$ alkyl group, a $C_1$-$C_{20}$ alkoxyl group or a phenyl group) in such fields as polymer solar cells, organic electroluminescent devices, organic field-effect transistors, organic optical memories, organic non-linear devices, and organic laser devices.

The following examples are the applications of a perylenetetracarboxylic diimide organic semiconductor material in the fields of organic solar cells, organic field-effect transistors, and organic electroluminescent devices.

Example 9

A polymer solar cell device has the structure as shown in FIG. 1. In this example, ITO glass is used as the substrate, glass as the substrate base material, and ITO as the conductive layer.

This polymer solar cell device has the following structure: Glass 11/an ITO layer 12/a PEDOT:PSS layer 13/an active layer 14/an Al layer 15; wherein: the active layer is made of the perylenetetracarboxylic diimide organic semiconductor material of the present invention; ITO is indium tin oxide having a sheet resistance of 10-20Ω/□, PEDOT is poly(3,4-ethylenedioxy thiophene), and PSS is poly(styrene sulfonic acid); preferably ITO having the sheet resistance of 10Ω/□ has a thickness of about 50-300 nm.

This polymer solar cell device was prepared through the following process:

Depositing one layer of the indium oxide tin (ITO) 12 having a sheet resistance of 10-20Ω/□ onto one surface of the glass substrate 11 to form a conductive layer as an anode having a thickness of about 50-300 nm;

ultrasonically cleaning and then oxygen-plasma processing the ITO glass, and then coating the ITO surface with one layer of the PEDOT:PSS layer 13 of about 20-300 nm in thickness having the modifying effect;

coating the poly(3,4-ethylenedioxy thiophene):PSS (poly(styrene sulfonic acid)) layer 13 with one layer of the active layer 14 having a thickness of about 50-300 nm by the spin-coating technology; this active layer is made of the perylenetetracarboxylic diimide organic semiconductor material of the present invention;

vacuum-evaporating metal aluminum onto the surface of the active layer to form the metal aluminum layer 15 as a cathode, thus producing the organic solar cell device; and encapsulating the polymer solar cell device with the epoxy resin, and annealing for 2 h under the airtight condition at 120° C. before cooling down to the room temperature; because the material of the device has a more regular and orderly chemical structure after being annealed, the transmission speed and efficiency of the carriers are improved, thus improving the photoelectric conversion efficiency of the device.

Preferably the thickness of the ITO layer, the PEDOT:PSS layer, the active layer and the Al layer is 150 nm, 50 nm, 120 nm and 110 nm, respectively.

Example 10

Figure 2:
FIG. 2 is a structural schematic view of the organic electroluminescent device with the organic semiconductor material of the present invention as the light-emitting layer.

An organic electroluminescent device has a structure as shown in FIG. 2. In this example, ITO glass is used as the substrate, glass as the substrate base material, and ITO as the conductive layer.

This organic electroluminescent device has the following structure: Glass 21/an ITO layer 22/a light-emitting layer 23/an LiF buffer layer 24/an Al layer 25; wherein: the light-emitting layer is made of the perylenetetracarboxylic diimide organic semiconductor material of the present invention.

This organic electroluminescent device was prepared through the following process:

Depositing one layer of the indium oxide tin (ITO) 22 having a sheet resistance of 10-20Ω/□ onto one surface of the glass substrate 21 to form a conductive layer as an anode having a thickness of 50-300 nm; preferably the ITO has a sheet resistance of 10Ω/□;

preparing on the ITO surface by the spin-coating technology the light-emitting layer 23 made of the perylenetetracarboxylic diimide organic semiconductor material of the present invention having a thickness of about 50-300 nm;

vacuum-evaporating LiF onto the light-emitting layer to be as the buffer layer 24 having a thickness of about 0.3-2 nm; and vacuum-evaporating metal aluminum onto the light-emitting layer to form the metal aluminum layer 25 as a cathode, thus producing the organic electroluminescent device.

Example 11

Figure 3:
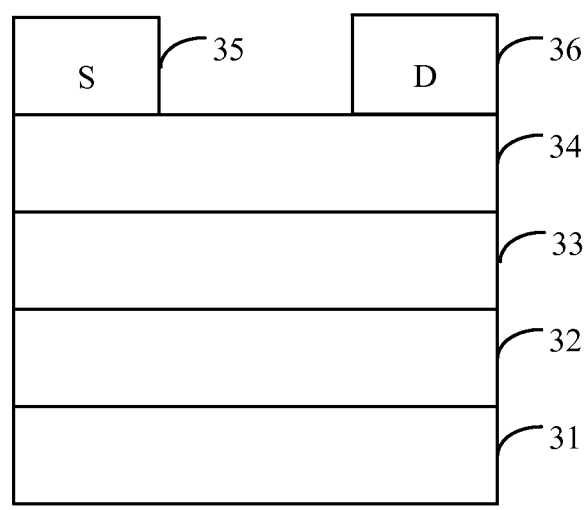
FIG. 3 is a structural schematic view of the organic field-effect transistor with the organic semiconductor material of the present invention as the organic semiconductor layer.

An organic field-effect transistor has a structure as shown in FIG. 3; a doped silicon wafer (Si) is used as the substrate in this example.

This organic field-effect transistor has the following structure: Si 31/a $SiO_2$ insulation layer 32 having a thickness of 450 nm/an octadecyltrichlorosilane (OTS) layer 33 for modification of $SO_2$/an organic semiconductor layer 34/a source electrode (S) 35 and a drain electrode (D) 36 made of gold; wherein the organic semiconductor layer is made of the perylenetetracarboxylic diimide organic semiconductor material of the present invention; wherein the source electrode (S) and the drain electrode (D) can also be made of copper.

This organic field-effect transistor was prepared through the following process:

First coating one surface of the cleaned doped silicon wafer 31 with one layer of the $SiO_2$ insulation layer 32; second coating the $SiO_2$ insulation layer with one layer of the octadecyltrichlorosilane 33 for modification having a thickness of 10-200 nm; then spin-coating the octadecyltrichlorosilane layer with the organic semiconductor layer 34 made of the perylenetetracarboxylic diimide organic semiconductor material of the present invention having a thickness of about 30-300 nm; and finally providing the organic semiconductor layer at intervals with the source electrode (S) 35 and the drain electrode (D) 36 made of gold, thus producing the organic field-effect transistor.

Although the invention has been described in language specific to structural features and/or methodological acts, it is to be understood that the invention defined in the appended claims is not necessarily limited to the specific features or acts described. Rather, the specific features and acts are disclosed as sample forms of implementing the claimed invention.

What is claimed is:

1. A perylenetetracarboxylic diimide organic semiconductor material, having the following structural formula (I):

(I)

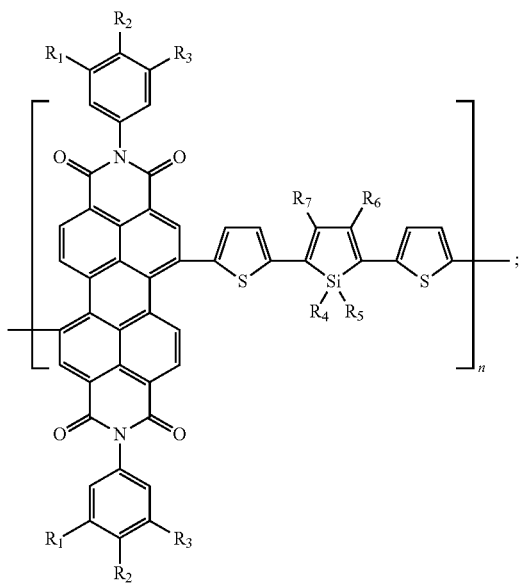

where: n is an integer of 1-100; $R_1$, $R_2$ and $R_3$ are a hydrogen atom, a $C_1$-$C_{20}$ alkyl group, a $C_1$-$C_{20}$ alkoxyl group, a phenyl group or alkoxy benzene, respectively; $R_4$ and $R_5$ are a $C_1$-$C_{20}$ alkyl group, respectively; and $R_6$ and $R_7$ are a hydrogen atom, a $C_1$-$C_{20}$ alkyl group, a $C_1$-$C_{20}$ alkoxyl group or a phenyl group, respectively.

2. A preparation method of the perylenetetracarboxylic diimide organic semiconductor material, characterized in that it comprises the following steps:

in an oxygen-free environment, in the presence of a catalyst and organic solvent, making perylenetetracarboxylic diimide dibromide with a structural formula of

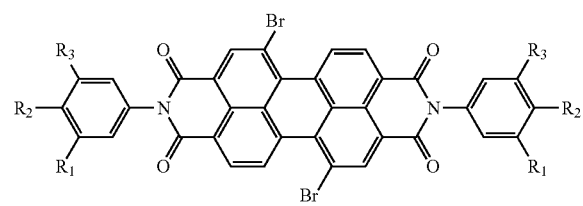

and 2,5-bis(5-tributyltin-thienyl)silole derivative with a structural formula of

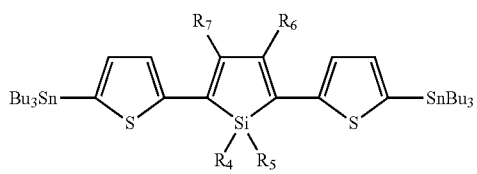

have the Stille coupling reaction, thus obtaining a reactant mixture solution containing the perylenetetracarboxylic diimide organic semiconductor material with the structural formula of

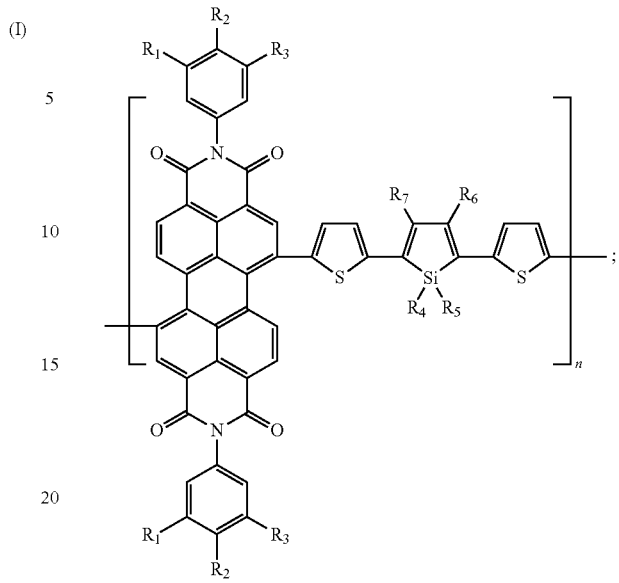

where: n is an integer of 1-100; $R_1$, $R_2$ and $R_3$ are a hydrogen atom, a $C_1$-$C_{20}$ alkyl group, a $C_1$-$C_{20}$ alkoxyl group, a phenyl group or alkoxy benzene; $R_4$ and $R_5$ are a $C_1$-$C_{20}$ alkyl group; and $R_6$ and $R_7$ are a hydrogen atom, a $C_1$-$C_{20}$ alkyl group, a $C_1$-$C_{20}$ alkoxyl group or a phenyl group.

3. The preparation method according to claim 2, characterized in that the catalyst is added at a molar ratio of 0.01% to 20% of the total materials.

4. The preparation method according to claim 2 or 3, characterized in that the catalyst is an organic palladium or a mixture of the organic palladium and an organophosphine ligand.

5. The preparation method according to claim 4, characterized in that the organic palladium is at least one of $Pd_2(dba)_3$, $Pd(PPh_3)_4$ and $Pd(PPh_3)_2Cl_2$; and the organophosphine ligand is $P(o-Tol)_3$.

6. The preparation method according to claim 4, characterized in that the mixture of the organic palladium and the organophosphine ligand has a molar ratio of the organic palladium to the organophosphine ligand of 1:1 to 1:20.

7. The preparation method according to claim 2, characterized in that the organic solvent is at least one of tetrahydrofuran, ethylene glycol dimethyl ether, dioxane, N,N-dimethylformamide, benzene or toluene.

8. The preparation method according to claim 2, characterized in that in the Stille coupling reaction, a molar ratio of the perylenetetracarboxylic diimide dibromide to the 2,5-bis(5-tributyltin-thienyl)silole derivative is from 1:1 to 2:1; and the Stille coupling reaction occurs at a temperature of 50° C. to 130° C. for a reaction time of 24 hours to 72 hours.

9. The preparation method according to claim 2, characterized in that after the Stille coupling reaction, the reactant mixture solution is further subject to the following purification processing steps:

adding the reactant mixture solution into methanol for sedimentation processing, then suction-filtering, washing with methanol, and drying, thus obtaining an organic semiconductor material colloid containing impurities; then dissolving with toluene to obtain a toluene solution containing the organic semiconductor material; and then adding the above toluene solution containing the organic semiconductor material into an aqueous solution of sodium diethyldithiocarbamate, heating and stirring the mixture solution at 80° C.-100° C., passing the mixture solution through the alumina chromatography column to separate the organic semiconductor material, then leaching with chlorobenzene, followed by decompression removal of the chlorobenzene organic solvent, and finally extracting the organic semiconductor material with the acetone Soxhlet, thus obtaining the solid organic semiconductor material.

10. An organic solid state device including a perylenetetracarboxylic diimide organic semiconductor material according to claim 1 wherein said organic solid state device is selected from the group of polymer solar cell, organic electroluminescent device, organic field-effect transistor, organic optical memorie, organic non-linear device, and organic laser device.

* * * * *